(12) United States Patent
Zhao et al.

(10) Patent No.: US 10,439,594 B2
(45) Date of Patent: Oct. 8, 2019

(54) ACTUALLY-MEASURED MARINE ENVIRONMENT DATA ASSIMILATION METHOD BASED ON SEQUENCE RECURSIVE FILTERING THREE-DIMENSIONAL VARIATION

(71) Applicants: Yuxin Zhao; HARBIN ENGINEERING UNIVERSITY, Harbin, Heilongjiang (CN)

(72) Inventors: Yuxin Zhao, Heilongjiang (CN); Chang Liu, Heilongjiang (CN); Xuefeng Zhang, Heilongjiang (CN); Liqiang Liu, Heilongjiang (CN); Gang Li, Heilongjiang (CN); Feng Gao, Heilongjiang (CN); Ning Li, Heilongjiang (CN); Zhifeng Shen, Heilongjiang (CN); Zhenxing Zhang, Heilongjiang (CN); Zhao Qi, Heilongjiang (CN)

(73) Assignee: HARBIN ENGINEERING UNIVERSITY (CN)

( * ) Notice: Subject to any disclaimer, the term of this patent is extended or adjusted under 35 U.S.C. 154(b) by 30 days.

(21) Appl. No.: 15/519,823

(22) PCT Filed: Dec. 1, 2014

(86) PCT No.: PCT/CN2014/001078
§ 371 (c)(1),
(2) Date: Apr. 17, 2017

(87) PCT Pub. No.: WO2016/086329
PCT Pub. Date: Jun. 9, 2016

(65) Prior Publication Data
US 2017/0338802 A1    Nov. 23, 2017

(51) Int. Cl.
*G06F 17/50* (2006.01)
*H03H 17/02* (2006.01)

(52) U.S. Cl.
CPC ......... *H03H 17/0282* (2013.01); *G06F 17/50* (2013.01); *H03H 17/0202* (2013.01); *H03H 2017/021* (2013.01)

(58) Field of Classification Search
None
See application file for complete search history.

(56) References Cited

U.S. PATENT DOCUMENTS

| | | | | |
|---|---|---|---|---|
| 8,152,366 B2 * | 4/2012 | Kang | ........................ | G01J 5/00 374/136 |
| 8,504,299 B2 * | 8/2013 | Dubberley | ............... | G06N 7/02 702/3 |

(Continued)

FOREIGN PATENT DOCUMENTS

| CN | 102737155 | 10/2012 |
|---|---|---|
| JP | 2002243445 | 8/2002 |

OTHER PUBLICATIONS

Xiao, Xianjun et al.: "The Ocean Assimilative Model and Verification of Three-Dimensional Variational of the South China Sea", Progress in Natural Science, vol. 17, No. 3, Mar. 31, 2007 (Mar. 31, 2007), pp. 75-83.

(Continued)

*Primary Examiner* — Michael D. Yaary
(74) *Attorney, Agent, or Firm* — Morriss O'Bryant Compagni Cannon, PLLLC

(57) ABSTRACT

The present invention provides an actually-measured marine environment data assimilation method based on sequence recursive filtering three-dimensional variation. The method includes: preprocessing actually-measured marine environment data; calculating a target function value; calculating a gradient value of a target function; calculating a minimum (Continued)

value of the target function; extracting space multi-scale information from the actually-measured data; and updating background field data to form a final data assimilation analysis field. The present invention improves the traditional recursive filtering three-dimensional variation method, and sequentially assimilates information with different scales, thereby effectively overcoming the problem that multi-scale information cannot be effectively extracted by a traditional three-dimensional variation method. A high-order recursive Gaussian filter is used, and a cascaded form of the high-order recursive filter is converted into a parallel structure, so that the recursive filtering process of the recursive Gaussian filter can be executed in parallel, and many problems caused by a cascaded filter are overcome.

8 Claims, 2 Drawing Sheets

(56) References Cited

U.S. PATENT DOCUMENTS 9,792,564 B2 * 10/2017 Helber .................. G06Q 10/00
2010/0082264 A1 4/2010 Barron et al.

OTHER PUBLICATIONS

He, Guangxin et al.: "The Scheme of High-Order Recursive Filter for the GRAPES-3dvar with Its Initial Experiments", Acta Meteorologica Sinica, Dec. 31, 2011 (Dec. 31, 2011), pp. 71-78.

* cited by examiner

ACTUALLY-MEASURED MARINE ENVIRONMENT DATA ASSIMILATION METHOD BASED ON SEQUENCE RECURSIVE FILTERING THREE-DIMENSIONAL VARIATION

CROSS-REFERENCE TO RELATED APPLICATIONS

This application is a national phase entry under 35 U.S.C. § 371 of PCT/CN2014/001078 filed on Dec. 1, 2014, the entirety of which is incorporated by reference.

TECHNICAL FIELD

The present invention relates to an actually-measured marine environment data assimilation method, and in particular, to an actually-measured marine environment data assimilation method based on sequence recursive filtering three-dimensional variation.

BACKGROUND

An ocean is an activity space of an underwater vehicle, and thermocline, internal waves and other meso- and micro-scale ocean processes in the ocean directly threat the navigation safety of the underwater vehicle and affect the smooth implementation of its tasks. Thus, real-time construction of a navigation environment field around the underwater vehicle and rapid diagnosis of the meso-micro scale ocean processes have important significance. Currently, the marine environment data are mainly obtained in two ways, one way is to calculate by a numerical model, but the data can only approximately reflect the regular features of the marine environment field and are difficult to extract the meso-micro scale ocean processes; and the other way is to directly measure by a sensor, such data are the most direct observation with higher precision to the marine environment field and contain important marine information. However, due to the limitation of observation equipment and the random variation of physical quantity of an observation point, an observation result has unavoidable systematic errors and random errors. Thus, the data obtained in the two ways have their own advantages and disadvantages.

A data assimilation method is a method combining observation data with a theoretical model, which is developed with the development of numerical calculation and numerical forecast business. It combines observation data obtained by different observation measures in different spaces, different times and with a mathematical model according to a certain optimization criteria and method, and establishes an optimal relation in which the model and the data coordinate with each other. By means of the data assimilation technology, effective information contained in the observation data can be maximally extracted to enhance and improve the performance of an analysis and forecast system. Therefore, the real-time observation data are combined with a theoretical model result by data assimilation to absorb the both advantages, and thus an approximately actual marine environment state field can be constructed. Three-dimensional variation is a common ocean data assimilation method. In the three-dimensional variation assimilation, a background field error covariance matrix plays an important role, which determines the degree of correction of an analysis field relative to a background field. One of the main problems researched by the traditional three-dimensional variation assimilation method is how to better construct the background field error covariance matrix. At present, there are mainly two three-dimensional variation assimilation methods, one is a correlation length method, and the other is a recursive filtering method. The correlation length method is used for constructing the background field error covariance matrix. However, the method has great randomness in the practical application, and it is difficult to give an accurate estimate on the relevant scale. Meanwhile, the method requires a huge internal memory and a huge calculation overhead. The recursive filtering method does not require explicit construction of the error covariance matrix, and compared with the correlation length method, the recursive filtering method has the advantages of high calculation speed and capability of saving the internal memory. But the correlation length method and the recursive filtering method have common defects, that is, it is difficult to effectively extract the multi-scale observation information. Thus, for the demands of the underground navigation of the underwater vehicle on the surrounding marine environment field, an efficient actually-measured marine environment data assimilation method is designed, which has an important practical value on the real-time construction of an underwater environment state field and the fast extraction of a multi-scale ocean process.

SUMMARY

The object of the present invention is to provide an actually-measured marine environment data assimilation method based on sequence recursive filtering three-dimensional variation, which can realize the real-time construction of an underwater environment state field and the fast extraction of a multi-scale ocean process.

The object of the present invention is achieved in this way:

Step 1, Carrying Out Quality Control and Preprocessing on Actually-measured Marine Environment Data filtering out invalid data and abnormal data in the actually-measured data at first, and then converting the actually-measured data into a format necessary for assimilation;

Step 2, Calculating a Target Function Value calculating the target function value by adopting the actually-measured marine environment data preprocessed in the last step and background field data by a parallel recursive filter by means of giving a filtering parameter;

Step 3, Calculating a Gradient Value of a Target Function calculating the gradient value of the target function based on the target function value and a source code of a gradient of the target function generated by a tangent and adjoint model compiler;

Step 4, Calculating a Minimum Value of the Target Function inputting the target function value and the gradient value of the target function in an LBFGS minimization algorithm to calculate the minimum value of the target function, wherein a state variable corresponding to the minimum value is a long wave estimate of observation data;

Step 5, Extracting Space Multi-scale Information from the Actually-measured Data subtracting the long wave estimate obtained in the step 4 from the actually-measured marine environment data to serve as new actually-measured data, adjusting the filtering parameter to decrease the same, meanwhile, replacing the actually-measured marine environment data in the step 2 with the new actually-measured data, and repeating the step 2 to the step 4 to sequentially extract the space multi-scale information from the actually-measured data; and Step 6, Updating the Background Field Data updating the background field data to form a final data assimilation analysis field.

The present invention provides an actually-measured marine environment data assimilation technology based on sequence recursive filtering three-dimensional variation. Compared with the actually-measured marine environment data assimilation technology adopting a traditional three-dimensional variation method, the present invention has the distinguishing features that the filtering parameter a is gradually changed to sequentially extract observation information with different scales. That is, at first, a larger value of a is taken, so the width of a frequency window of the filter becomes narrow, only long wave (low frequency) information can pass through, and the long wave estimate can be obtained by the assimilation of the recursive filtering method; then, the obtained long wave estimate is subtracted from the actually-measured marine environment data to serve as the new actually-measured data, the a is properly adjusted to decrease the same, so the width of the frequency window of the filter becomes wide, secondary long wave information can pass through, and a secondary long wave estimate is obtained by assimilation; and so on, the information of different wavebands is gradually extracted. The method provided by the present invention can overcome the problem that the multi-scale information cannot be effectively extracted by a traditional three-dimensional variation method.

The present invention has the following advantages:

(1) The traditional recursive filtering three-dimensional variation method is improved, and the information with different scales is assimilated in sequence to effectively overcome the problem that the multi-scale information cannot be effectively extracted by a traditional three-dimensional variation method.

(2) A high-order recursive Gaussian filter is used, and a cascaded form of the high-order recursive filter is converted into a parallel structure, so that the recursive filtering process of the recursive Gaussian filter can be executed in parallel, and many problems caused by a cascaded filter are overcome.

DETAILED DESCRIPTION OF THE PREFERRED EMBODIMENTS

The present invention will be described below in more detail by examples.

Figure 1:
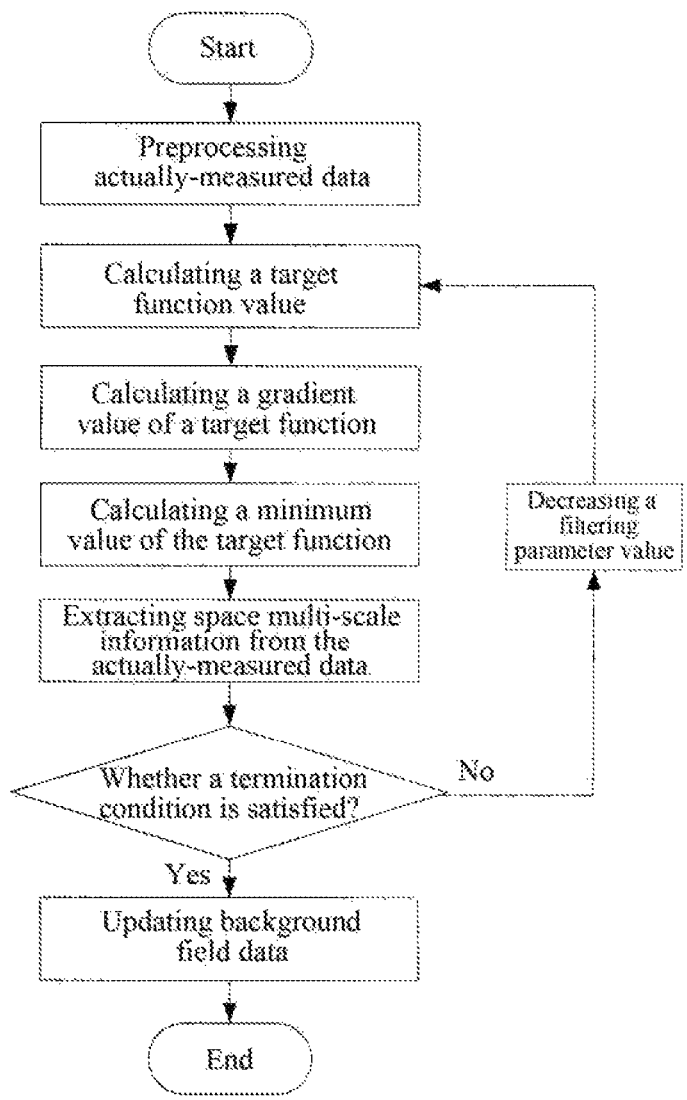
FIG. 1 is a flowchart of actually-measured marine environment data assimilation.

In combination with FIG. 1, the present invention mainly includes the following steps:

Step 1, Preprocessing Actually-measured Marine Environment Data

In order to assimilate the actually-measured marine environment data in a background field database, at first, quality control of the actually-measured data is carried out to filter out invalid data and abnormal data in the actually-measured data, and then the actually-measured data after the quality control are converted into a format necessary for assimilation, for example, a common ASCII format or a binary storage format.

Step 2, Calculating a Target Function Value

The target function value is calculated by adopting the actually-measured marine environment data preprocessed in the last step and background field data by a parallel recursive filter by means of giving a filtering parameter.

Step 3, Calculating a Gradient Value of a Target Function

The gradient value of the target function is calculated based on the target function value and a source code of a gradient of the target function generated by a tangent and adjoint model compiler.

Step 4, Calculating a Minimum Value of the Target Function

The target function value and the gradient value of the target function are input in an LBF GS (limited memory Broyden-Fletcher-Glodfarb-Shanno) minimization algorithm to calculate the minimum value of the target function, wherein a state variable corresponding to the minimum value is a long wave estimate of observation data.

Step 5, Extracting Space Multi-scale Information from the Actually-measured Data The long wave estimate obtained in the step 4 is subtracted from the actually-measured marine environment data to serve as new actually-measured data, the filtering parameter is adjusted to decrease it, meanwhile, the actually-measured marine environment data in the step 2 are replaced by the new actually-measured data, and the step 2 to the step 4 are repeated to sequentially extract secondary long wave and short wave information from the actually-measured data.

Step 6, Updating the Background Field Data

The background field data are updated to form a final data assimilation analysis field.

Figure 2:
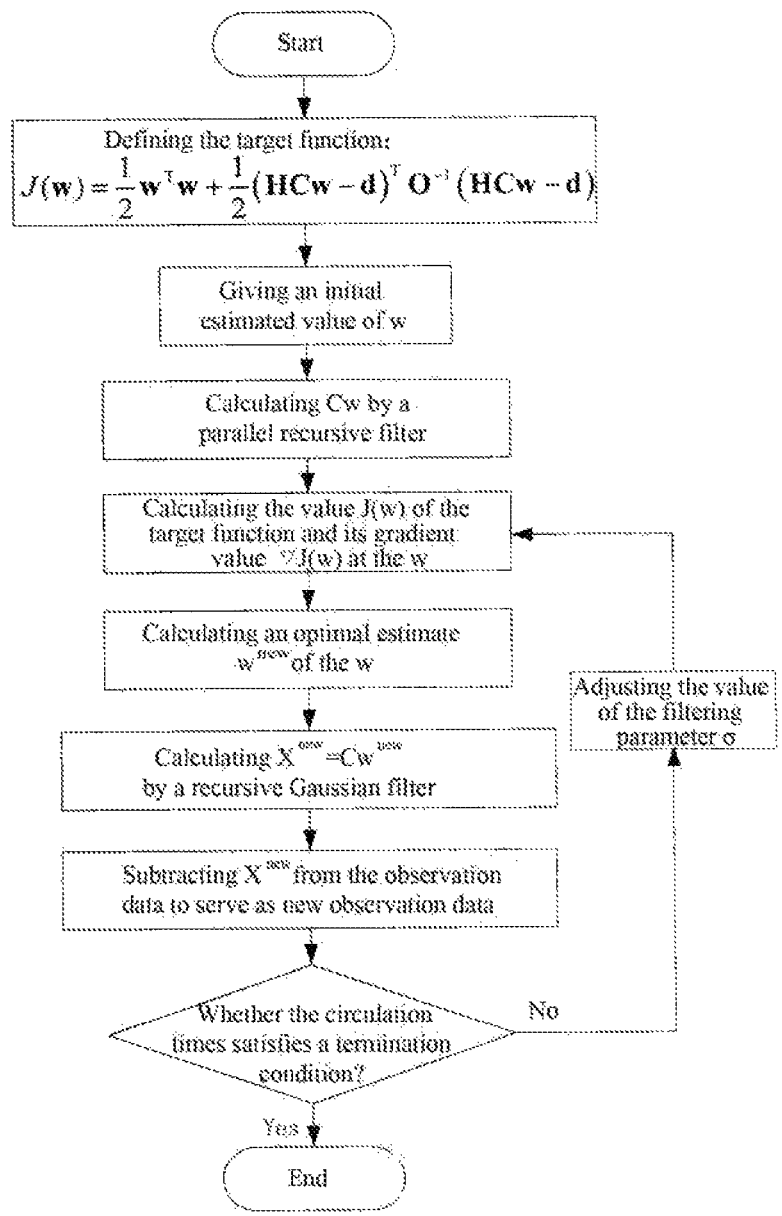
FIG. 2 is an execution flowchart of sequence recursive filtering three-dimensional variation.

The present invention will be described below in more detail in combination with FIG. 2.

Step 1, Carrying Out Preprocessing and Quality Control on Actually-measured Marine Environment Data In order to eliminate errors and irregular data contained in the observation data as much as possible, preprocessing and quality control are carried out on the actually-measured marine environment data firstly. In the present invention, the preprocessing and quality control of the data are completed by the following six steps: area test, repeated depth test, depth inverse test, temperature data range test, temperature and salinity gradient test and density stability test.

Step 1.1, Area Test

In order to locate the actually-measured marine environment data within a certain range around an underwater vehicle, the area test needs to be carried out, the test method adopted in the present invention is an area search method, that is, if the actually-measured marine environment data are within a longitude and latitude range selected by a user, the actually-measured marine environment data are retained, and if the actually-measured marine environment data are beyond the range, it is removed, and the data range can be set according to the demand of the user.

Step 1.2, Repeated Depth Test

In order to remove repeated depth data from an observation profile, the repeated depth test needs to be carried out. The test method adopted in the present invention is a linear search method, that is, for each observation profile, if repeated depth data are searched from the profile, the repeated depth data are marked, a human-computer interaction test is carried out, and one repeated profile is removed according to the principle of continuity and consistency of the marine environment data on the same depth layer with upper and lower layers.

Step 1.3, Depth Inverse Test

In order to check whether a virtual depth inverse exists in the observation data, the depth inverse test needs to be carried out. The test method adopted in the present invention is the linear search method, when depth inverse data are found, the depth inverse data are marked, the human-computer interaction test is further carried out, and the marine environment data of an effective depth layer are retained in combination with the observation data of the upper and lower layers and the surrounding observation data.

Step 1.4, Data Range Test of Temperature and Salinity

In order to ensure that no extreme value occurs in temperature and salinity observation data, the data range test needs to be carried out. The test method adopted in the present invention is a comparison test method, that is, a maximum temperature and salinity range and a minimum temperature and salinity range of each sea area are counted and given in advance, if the temperature and salinity observation data exceed the ranges, the temperature and salinity observation data are removed.

Step 1.5, Temperature and Salinity Gradient Test

In order to ensure that no extreme value occurs in a temperature and salinity observation profile gradient, the gradient test needs to be carried out. The test method adopted in the present invention is the comparison test method, that is, a maximum gradient value range of temperature and salinity of each sea area is counted and given in advance, if the temperature and salinity observation data exceed the range, the temperature and salinity observation data are removed.

Step 1.6, Density Stability Test

In order to ensure that no virtual density inverse occurs in the observation profile data, the density stability test needs to be carried out. The test method adopted in the present invention is the linear search method, that is, the density value of each layer is compared from top to bottom, if the density of the lower layer is smaller than the density of the upper layer, the lower layer is marked, the human-computer interaction test is further carried out, the authenticity of the density inverse is judged in combination with the marine environment features of the observation area and the historical observation data of the sea area, if the density inverse is true, the density inverse is retained, and otherwise, the density inverse is removed.

Step 1.7, Preprocessing the Actually-measured Marine Environment Data After the Quality Control The actually-measured data after the quality control in the step 1.1 to the step 1.6 are converted into a format necessary for assimilation, for example, a common ASCII format or a binary storage format, to serve as an input interface of the next data assimilation process.

Step 2, Calculating a Target Function Value of Sequence Recursive Filtering Three-dimensional Variation In order to calculate a minimum value of a target function to obtain an optimal estimate of a state variable of the observation data, the target function value needs to be calculated in advance. The specific calculation method is as follows:

Step 2.1, Defining the Target Function

In order to avoid an inverse of a background field error covariance matrix with a very large calculating amount, the target function adopted in the present invention is:

$$J(w) = \frac{1}{2} w^y B w + \frac{1}{2}(HBw-d)^y O^{-1}(HBw-d)$$

wherein, J represents the target function, $w = B^{-1}(x-x_b)$, B represents the background field error covariance matrix, $x_b$ represents a background field (generally a forecast field) vector, and x represents the state variable. O represents an observation field error covariance matrix, H represents an interpolation operator from a mode grid to an observation point, $d = y - Hx_b$, and y represents a measurement vector. The background field is obtained by data assimilation step forward integration by an ocean numerical model. A control variable of the target function is w.

Step 2.2, Giving an Initial Estimated Value of w

According to the expression of the target function, before the optional w is obtained by an optimization algorithm, an initial estimated value of w needs to be given. In the present invention, the initial estimated value of the w is set as 0, according to a calculation formula of the w in the step 2.1, when the initial estimated value of the w is set as 0, the initial estimated value of the state variable is indirectly set as the value $x_b$ of the background field.

Step 2.3, Calculating Bw by Parallel Recursive Filtering

A calculation process of Bw is simulated by a parallel recursive filter in the present invention, and a transfer function S (z) of the parallel recursive filter is defined as:

$$S(z) = S_1(z) + S_2(z) + S_3(z) + S_4(z)$$

the filter is actually a low-order parallel form converted from a four-order van Vliet recursive Gauss filter. Wherein, the function $S_i(z)$ (i=1, 2, 3, 4) is calculated according to the following formula:

$$S_1(z) = \frac{e_1 z + f_1}{(z-d_1)(z-d_2)}$$

$$S_2(z) = \frac{e_2 z + f_2}{(z-d_3)(z-d_4)}$$

$$S_3(z) = \frac{e_3 z + f_3}{(1-d_1 z)(1-d_2 z)}$$

$$S_4(z) = \frac{e_4 z + f_4}{(1-d_3 z)(1-d_4 z)}$$

wherein, $e_i$, $f_i$ (i=1, 2, 3, 4) represents an undetermined coefficient, and it can be known by calculation that:

$$e_1 = 2Re(c_1), f_1 = -2Re(c_1 d_2)$$

$$e_2 = 2Re(c_2), f_2 = -2Re(c_3 d_4)$$

$$e_3 = -2Re(c_3 d_3), f_3 = 2Re(c_3)$$

$$e_4 = -2Re(c_4 d_4), f_4 = 2Re(c_4)$$

wherein, Re(.) represents taking a real part of a complex number, $c_i$, $d_i$ (i=1, 2, 3, 4) represents an undetermined coefficient, and it can be known by calculation that:

$$c_1 = S\_(d_1) \cdot \frac{\alpha d_1^4}{(d_1-d_2)(d_1-d_3)(d_1-d_4)}$$

$$c_2 = S\_(d_3) \cdot \frac{\alpha d_3^4}{(d_3-d_1)(d_3-d_2)(d_3-d_4)}$$

$$c_3 = c_1 d_1^{-1}$$

$$c_4 = c_2 d_3^{-1}$$

$$d_1(\sigma) = d_1(\sigma_0)^{\frac{1}{q}} \quad d_1(\sigma_0) = 1.13228 + 1.28114i$$
$$d_2(\sigma) = d_1^*(\sigma) \quad d_2(\sigma_0) = d_1^*$$
$$d_3(\sigma) = d_3(\sigma_0)^{\frac{1}{q}} \quad d_3(\sigma_0) = 1.78534 - 0.46763i$$
$$d_4(\sigma) = d_3^*(\sigma) \quad d_4(\sigma_0) = d_3^*$$

, $q = \frac{\sigma}{\sigma_0}$, $\sigma_0 = 2, \sigma > 0$, superscript "*" represents conjugate, and a represents a filtering parameter.

Wherein, $S_{-1}(z)$ ($z=d_1, d_3$) represents the transfer function of the four-order van Vliet recursive Gauss filter, and the expression thereof is as follows:

$$S_{-1}(z) = \frac{\alpha}{1 + \sum_{i=1}^{4} b_i z^i}$$

in the above formula, the expressions of $b_i$ (i=1, 2, 3, 4) and $\alpha$ are as follows:

$$b_1 = -\prod_{i=1}^{4} d_i^{-1} \sum_{i=3}^{4} \sum_{j=2}^{i-1} \sum_{k=1}^{j-1} d_i d_j d_k$$

$$b_2 = -\prod_{i=1}^{4} d_i^{-1} \sum_{i=2}^{4} \sum_{j=1}^{i-1} d_i d_j$$

$$b_3 = -\prod_{i=1}^{4} d_i^{-1} \sum_{i=1}^{4} d_i$$

$$b_4 = -\prod_{i=1}^{4} d_i^{-1}$$

$$\alpha = 1 + \sum_{i=1}^{4} b_i;$$

Step 2.4, Calculating an Observation Increment: $d=y-Hx_b$

H represents a bilinear interpolation operator, and a mode space is mapped into an observation space by the H. In the present invention, the H is calculated by a bilinear inverse distance method, namely, when state values of four grid points on a unit grid of the mode are interpolated in an observation position in the unit grid, physical distances from the four grid points to the observation point are calculated firstly, and then, weighted average is carried out on the state values of the four mode grids with inverse ratios of the distances as weights to obtain the state value of the observation position.

Step 2.5, Calculating the Target Function Value J(w)

The values of w, Bw and d calculated in the steps 2.2, 2.3 and 2.4 are brought in the target function determined in the step 2.1 to calculate the target function value.

Step 3, Calculating a Gradient Value of the Target Function

To calculate a minimum value of the target function to control the optimal estimate of a control variable, the gradient value of the target function to w needs to be calculated in advance. The specific calculation method is as follows:

Step 3.1, Defining a Gradient of the Target Function the calculation formula of the gradient of the target function adopted in the present invention is as follows:

$$\nabla J = B(w - H^T O^{-1}(d - HBw))$$

wherein, the superscript "T" represents transposition, and the meanings of other symbols are consistent with those in the calculation formula of the target function defined in the step 2.1.

Step 3.2 Generating a Source Code of the Gradient of the Target Function Based on a Tangent and Adjoint Model Compiler Since a recursive filtering algorithm is needed when the target function value is calculated, it is difficult to directly calculate the gradient of the target function by the definition. For the convenience of calculation, a Fortran calculation source code for calculating the target function is input in the TAMC, and the compiler automatically returns a Fortran source code of the gradient of the target function.

Step 3.3, Calculating the Gradient Value $\nabla J$ of the Target Function

The gradient value of the target function to the w will be obtained by operating the Fortran source code of the gradient of the target function calculated in the step 3.2.

Step 4, Calculating The Minimum Value Of The Target Function

To obtain the optimal estimate of the control variable, the minimum value of the target function needs to be calculated. The specific calculation method is as follows:

step 4.1, inputting the target function value and the gradient value of the target function in an LBFGS (limited memory Broyden-Fletcher-Glodfarb-Shanno) minimization algorithm;

step 4.2, automatically determining a feasible descent direction and a search step length at the control variable by the minimization algorithm according to the gradient value and the target function value, wherein the feasible descent direction and the search step length are used for determining an initial value of the control variable of next linear search in the optimization algorithm; and step 4.3, updating the control variable w by the analysis field obtained by the optimization algorithm, calculating the gradient value $\nabla J$ of the target function again, judging whether the gradient meets a convergence criteria at the moment, and if not, repeating the steps 4.1 to 4.2, continuing to calculate until the convergence criteria is met; if the gradient meets the convergence criteria, logging out the calculation, wherein the value of a state variable x corresponding to the minimum value obtained at the moment is the optimal estimate of the background field, namely the analysis field. The optimal estimate is optimal under the least-square meaning.

The convergence criteria adopted in the present invention is as follows:

$|\nabla j|/|\nabla J_0| < 0.01$, wherein, $\nabla J_0$ represents the gradient value of the target function in the first iteration.

Step 5, Extracting Space Multi-scale Information from the Actually-measured Data In order to extract the multi-scale marine environment information from the observation data, a sequence recursive filtering process needs to be carried out. The specific calculation method is as follows:

step 5.1, calculating $x^{new} = Bw^{new}$ by the recursive Gauss filter in the step 2.3;

step 5.2, subtracting the long wave estimate obtained in the step 5.1 from the observation data to serve as new observation data, that is, $d = d - Hx^{new}$. The observation data herein refer to a margin obtained by subtracting the long wave estimate obtained in the step 5.1 from the preprocessed observation value obtained in the step 1;

step 5.3, adjusting the value of σ to decrease it, that is, making $\sigma = \sigma^{(m)} < \sigma^{(m-1)}$;

wherein a decreases in an exponential decay mode, for example, $\sigma = \sigma/2^{M-1}$, wherein M represents a circulation times, which is generally 8;

step 5.4, judging whether a termination condition is satisfied; if not, recording the current state variable x, and turning to the step 2; and if the termination condition is satisfied, turning to a step 6.

Whether the circulation times satisfy a set time M is used as the termination condition. The circulation times M is generally 8, and at this time, the α value is reduced to 0.7% of the initial value σ.

Step 6, Updating the Background Field Data

The state variable x obtained in each circulation among the M times of circulation in the step 5 is accumulated to obtain the final analysis field, and then a data assimilation process is completed. The analysis field can be used as a data field for reflecting the current marine environment state.

The invention claimed is:

1. A system for determining an underwater marine environment based on sequence recursive filtering three-dimensional variation, comprising:
a plurality of sensors configured to measure and generate actually-measured marine environment data proximate an underwater vehicle;
a computer system for receiving the marine environment data from the plurality of sensors, the computer system comprising a processor, the processor
configured to:
carry out preprocessing and quality control on the actually-measured marine environment data by filtering out invalid data and abnormal data in the actually-measured marine environment data and then converting the actually-measured marine environment data into a format necessary for assimilation;
calculate a target function value by adopting the preprocessed actually-measured marine environment data and background field data by a parallel recursive filter by giving a filtering parameter;
calculate a gradient value of the target function based on the target function value and a source code of a gradient of the target function generated by a tangent and adjoint model compiler;
calculate a minimum value of the target function by inputting the target function value and the gradient value of the target function in a limited Broyden-Fletcher-Glodfarb-Shanno minimization algorithm to calculate the minimum value of the target function, wherein a state variable corresponding to the minimum value is a long wave estimate of observation data;
extract space multi-scale information from the actually-measured data by subtracting the long wave estimate from the actually-measured marine environment data to serve as new actually-measured marine environment data, adjust the filtering parameter to decrease it, replace the actually-measured marine environment data with the new actually-measured marine environment data, and repeat the steps of calculating a target function value, calculate a gradient value of the target function and calculate a minimum value of the target function to sequentially extract the secondary long wave and short wave information from the actually-measured marine environment data; and
update the background field data to form a final data assimilation analysis field.

2. The system of claim 1, wherein the processor is configured to:
calculate a target function value wherein the target function is defined as $$J(w) = \frac{1}{2}w^T B w + \frac{1}{2}(HBw - d)^T O^{-1}(HBw - d)$$

where J represents the target function, $w=B^{-1}(x-x_b)$, B represents a background field error covariance matrix, $x_b$ represents a background field vector, x represents a state variable, O represents an observation field error covariance matrix, H represents an interpolation operator from a mode grid to an observation point, $d=y-Hx_b$, y represents a measurement vector, and the background field is obtained by data assimilation step forward integration by an ocean numerical model;
give an initial estimated value of w by setting the initial estimated value of the w as 0, and indirectly assuming the initial estimated value of the state variable x as the value $x_b$ of the background field;
calculate Bw by parallel recursive filtering,
wherein a transfer function S (z) of the parallel recursive filter is defined as:

$S(z)=S_1(z)+S_2(z)+S_3(z)+S_4(z)$ wherein the parallel recursive filter is a low-order parallel form converted from a four-order van Vliet recursive Gauss filter, wherein, the function $S_i(z)$, i=1, 2, 3, 4 is calculated according to the following formula:

$$S_1(z) = \frac{e_1 z + f_1}{(z-d_1)(z-d_2)}$$

$$S_2(z) = \frac{e_2 z + f_2}{(z-d_3)(z-d_4)}$$

$$S_3(z) = \frac{e_3 z + f_3}{(1-d_1 z)(1-d_2 z)}$$

$$S_4(z) = \frac{e_4 z + f_4}{(1-d_3 z)(1-d_4 z)}$$

where $e_i$, $f_i$ (i=1, 2, 3, 4) represents an undetermined coefficient, and by calculation:

$e_1=2Re(c_1), f_1=-2Re(c_1 d_2)$ $e_2=2Re(c_2), f_2=-2Re(c_3 d_4)$ $e_3=-2Re(c_3 d_3), f_3=2Re(c_3)$ $e_4=-2Re(c_4 d_4), f_4=2Re(c_4)$ where Re(.) represents taking a real part of a complex number, $c_i$, $d_i$(i=1, 2, 3, 4) represents an undetermined coefficient, and i by calculation:

$$c_1 = S\_(d_1) \cdot \frac{\alpha d_1^4}{(d_1-d_2)(d_1-d_3)(d_1-d_4)}$$

$$c_2 = S\_(d_3) \cdot \frac{\alpha d_3^4}{(d_3-d_1)(d_3-d_2)(d_3-d_4)}$$

$c_3 = c_1 d_1^{-1}$ $c_4 = c_2 d_3^{-1}$

-continued $$d_1(\sigma) = d_1(\sigma_0)^{\frac{1}{q}}$$
$$d_2(\sigma) = d_1^*(\sigma)$$
$$d_3(\sigma) = d_3(\sigma_0)^{\frac{1}{q}}$$
$$d_4(\sigma) = d_3^*(\sigma)$$

$$q = \frac{\sigma}{\sigma_0},$$

$$d_1(\sigma_0) = 1.13228 + 1.28114i$$
$$d_2(\sigma_0) = d_1^*$$
$$d_3(\sigma_0) = 1.78534 - 0.46763i$$
$$d_4(\sigma_0) = d_3^*$$

$$\sigma_0 = 2, \sigma > 0,$$

where superscript "*" represents conjugate, and σ represents a filtering parameter;
where $S_{-1}(z)$ $(z=d_1,d_3)$ represents the transfer function of the four-order van Vliet recursive Gauss filter, and the expression thereof is as follows:

$$S_{-1}(z) = \frac{\alpha}{1 + \sum_{i=1}^{4} b_i z^i}$$

where $b_i(i=1, 2, 3, 4)$ and α are as follows:

$$b_1 = -\prod_{i=1}^{4} d_i^{-1} \sum_{i=3}^{4} \sum_{j=2}^{i-1} \sum_{k=1}^{j-1} d_i d_j d_k$$

$$b_2 = -\prod_{i=1}^{4} d_i^{-1} \sum_{i=2}^{4} \sum_{j=1}^{i-1} d_i d_j$$

$$b_3 = -\prod_{i=1}^{4} d_i^{-1} \sum_{i=1}^{4} d_i$$

$$b_4 = -\prod_{i=1}^{4} d_i^{-1}$$

$$\alpha = 1 + \sum_{i=1}^{4} b_i;$$

calculate an observation increment: $d=y-Hx_b$;
calculate the target function value J(w); and
bring the values of w, Bw and d in the target function to calculate the target function value.

3. The system of claim 2, wherein the processor is configured to calculate a gradient value of a target function where a gradient of the target function is defined as $$\nabla J = B(w - H^T O^{-1}(d - HBw))$$

where T represents transposition;
generating a source code of the gradient of the target function by a tangent and adjoint model compiler; and
calculate the gradient value ∇J of the target function by operating a Fortran source code of the gradient of the target function to obtain the gradient value of the target function to the w.

4. The system of claim 3, wherein the processor is configure to determine the extracting space multi-scale information from the actually-measured data by:
calculating $x^{new}=Bw^{new}$ by the recursive Gauss filter;
subtracting the long wave estimate from the observation data to serve as new observation data, $d=d-Hx^{new}$;
adjusting the value of a to decrease it, making $\sigma=\sigma^{(m)}<\sigma^{(m-1)}$, wherein σ decreases in an exponential decay mode wherein M represents a circulation time; and determining whether a termination condition is satisfied, and if not, recording the current state variable x, and calculating a target function value and if so, updating the background field data.

5. A method for determining an underwater marine environment based on sequence recursive filtering three-dimensional variation, comprising:
using a plurality of sensors on an underwater vehicle to measure and generate actually-measured marine environment data proximate the underwater vehicle;
receiving the marine environment data from the plurality of sensors in a computer system of the underwater vehicle, the computer having a processor, the processor configured to:
carry out preprocessing and quality control on the actually-measured marine environment data by filtering out invalid data and abnormal data in the actually-measured marine environment data and then converting the actually-measured marine environment data into a format necessary for assimilation;
calculate a target function value by adopting the preprocessed actually-measured marine environment data and background field data by a parallel recursive filter by giving a filtering parameter;
calculate a gradient value of the target function based on the target function value and a source code of a gradient of the target function generated by a tangent and adjoint model compiler;
calculate a minimum value of the target function by inputting the target function value and the gradient value of the target function in a limited Broyden-Fletcher-Glodfarb-Shanno minimization algorithm to calculate the minimum value of the target function, wherein a state variable corresponding to the minimum value is a long wave estimate of observation data;
extract space multi-scale information from the actually-measured data by subtracting the long wave estimate from the actually-measured marine environment data to serve as new actually-measured marine environment data, adjust the filtering parameter to decrease it, replace the actually-measured marine environment data with the new actually-measured marine environment data, and repeat the steps of calculating a target function value, calculate a gradient value of the target function and calculate a minimum value of the target function to sequentially extract the secondary long wave and short wave information from the actually-measured marine environment data; and
update the background field data to form a final data assimilation analysis field.

6. The method of claim 5, further comprising using the processor to:
calculate a target function value wherein the target function is defined as $$J(w) = \frac{1}{2} w^T Bw + \frac{1}{2}(HBw - d)^T O^{-1}(HBw - d)$$

where J represents the target function, $w=B^{-1}(x-x_b)$, B represents a background field error covariance matrix, $x_b$ represents a background field vector, x represents a state variable, O represents an observation field error covariance matrix, H represents an interpolation operator from a mode grid to an observation point, $d=y-Hx_b$, y represents a measurement vector, and the background field is obtained by data assimilation step forward integration by an ocean numerical model;

give an initial estimated value of w by setting the initial estimated value of the w as 0, and indirectly assuming the initial estimated value of the state variable x as the value $x_b$ of the background field;

calculate Bw by parallel recursive filtering,
  wherein a transfer function S (z) of the parallel recursive filter is defined as:

$S(z)=S_1(z)+S_2(z)+S_3(z)+S_4(z)$ wherein the parallel recursive filter is a low-order parallel form converted from a four-order van Vliet recursive Gauss filter, wherein, the function $S_i(z)$, i=1, 2, 3, 4 is calculated according to the following formula:

$$S_1(z) = \frac{e_1 z + f_1}{(z-d_1)(z-d_2)}$$

$$S_2(z) = \frac{e_2 z + f_2}{(z-d_3)(z-d_4)}$$

$$S_3(z) = \frac{e_3 z + f_3}{(1-d_1 z)(1-d_2 z)}$$

$$S_4(z) = \frac{e_4 z + f_4}{(1-d_3 z)(1-d_4 z)}$$

where $e_i$, $f_i$(i=1, 2, 3, 4) represents an undetermined coefficient, and by calculation:

$e_1 = 2Re(c_1), f_1 = -2Re(c_1 d_2)$ $e_2 = 2Re(c_2), f_2 = -2Re(c_3 d_4)$ $e_3 = -2Re(c_3 d_3), f_3 = 2Re(c_3)$ $e_4 = -2Re(c_4 d_4), f_4 = 2Re(c_4)$ where Re(.) represents taking a real part of a complex number, $c_i$, $d_i$(i=1, 2, 3, 4) represents an undetermined coefficient, and i by calculation:

$$c_1 = S_-(d_1) \cdot \frac{\alpha d_1^4}{(d_1-d_2)(d_1-d_3)(d_1-d_4)}$$

$$c_2 = S_-(d_3) \cdot \frac{\alpha d_3^4}{(d_3-d_1)(d_3-d_2)(d_3-d_4)}$$

$$c_3 = c_1 d_1^{-1}$$

$$c_4 = c_2 d_3^{-1}$$

$d_1(\sigma) = d_1(\sigma_0)^{\frac{1}{q}}$    $d_1(\sigma) = 1.13228 + 1.28114i$ $d_2(\sigma) = d_1^*(\sigma)$    $d_2(\sigma_0) = d_1^*$ $d_3(\sigma) = d_3(\sigma_0)^{\frac{1}{q}}$, $q = \frac{\sigma}{\sigma_0}$, $d_3(\sigma_0) = 1.78534 - 0.46763i$, $\sigma_0 = 2, \sigma > 0$, $d_4(\sigma) = d_3^*(\sigma)$    $d_4(\sigma_0) = d_3^*$ where superscript "*" represents conjugate, and a represents a filtering parameter;

where $S_{-1}(z)(z=d_i, d_3)$ represents the transfer function of the four-order van Vliet recursive Gauss filter, and the expression thereof is as follows:

$$S_{-1}(z) = \frac{\alpha}{1 + \sum_{i=1}^{4} b_i z^i}$$

where $b_i$ (i=1, 2, 3, 4) and $\alpha$ are as follows:

$$b_1 = -\prod_{i=1}^{4} d_i^{-1} \sum_{i=3}^{4} \sum_{j=2}^{i-1} \sum_{k=1}^{j-1} d_i d_j d_k$$

$$b_2 = -\prod_{i=1}^{4} d_i^{-1} \sum_{i=2}^{4} \sum_{j=1}^{i-1} d_i d_j$$

$$b_3 = -\prod_{i=1}^{4} d_i^{-1} \sum_{i=1}^{4} d_i$$

$$b_4 = -\prod_{i=1}^{4} d_i^{-1}$$

$$\alpha = 1 + \sum_{i=1}^{4} b_i;$$

calculate an observation increment: $d=y-Hx_b$;
calculate the target function value J(w); and
bring the values of w, Bw and d in the target function to calculate the target function value.

7. The method of claim 6, further comprising using the processor to calculate a gradient value of a target function where a gradient of the target function is defined as $\nabla J = B(w - H^T O^{-1}(d - HBw))$ where T represents transposition;
generating a source code of the gradient of the target function by a tangent and adjoint model compiler; and
calculate the gradient value $\nabla J$ of the target function by operating a Fortran source code of the gradient of the target function to obtain the gradient value of the target function to the w.

8. The method of claim 7, further comprising using the processor to determine the extracting space multi-scale information from the actually-measured data by:
calculating $x^{new}=Bw^{new}$ by the recursive Gauss filter;
subtracting the long wave estimate from the observation data to serve as new observation data, $d=d-Hx^{new}$;
adjusting the value of a to decrease it, making $\sigma=\sigma^{(m)}<\sigma^{(m-1)}$, wherein $\sigma$ decreases in an exponential decay mode wherein M represents a circulation time; and
determining whether a termination condition is satisfied, and if not, recording the current state variable x, and calculating a target function value and if so, updating the background field data.

\* \* \* \* \*